(12) United States Patent
Xiao et al.

(10) Patent No.: US 11,856,776 B2
(45) Date of Patent: Dec. 26, 2023

(54) STRUCTURE OF 3D NAND MEMORY DEVICE AND METHOD OF FORMING THE SAME

(71) Applicant: Yangtze Memory Technologies Co., Ltd., Wuhan (CN)

(72) Inventors: Li Hong Xiao, Wuhan (CN); Li Xun Gu, Wuhan (CN)

(73) Assignee: Yangtze Memory Technologies Co., Ltd., Wuhan (CN)

( * ) Notice: Subject to any disclaimer, the term of this patent is extended or adjusted under 35 U.S.C. 154(b) by 185 days.

(21) Appl. No.: 17/486,951

(22) Filed: Sep. 28, 2021

(65) Prior Publication Data

US 2022/0013541 A1    Jan. 13, 2022

Related U.S. Application Data

(60) Division of application No. 16/198,736, filed on Nov. 21, 2018, now abandoned, which is a continuation of
(Continued)

(51) Int. Cl.
*H10B 43/27* (2023.01)
*H01L 21/28* (2006.01)
(Continued)

(52) U.S. Cl.
CPC ....... *H10B 43/27* (2023.02); *H01L 21/02532* (2013.01); *H01L 21/02636* (2013.01);
(Continued)

(58) Field of Classification Search
CPC ... H10B 43/27; H10B 43/35; H01L 21/02532; H01L 21/02636; H01L 21/31111; H01L 21/31144
See application file for complete search history.

(56) References Cited

U.S. PATENT DOCUMENTS 9,502,432 B1    11/2016 Shin
9,576,967 B1 *   2/2017 Kimura ................. H10B 43/10
(Continued)

FOREIGN PATENT DOCUMENTS

CN    106206507 A    12/2016
CN    106920772 A     7/2017
(Continued)

OTHER PUBLICATIONS

Williams et al., "Etch Rates for Micromachining Processing—Part II", Journal of Microelectromechanical Systems, Dec. 2003, pp. 761-778, vol. 12, No. 6.

*Primary Examiner* — Shih Tsun A Chou
(74) *Attorney, Agent, or Firm* — Winston Hsu (57) ABSTRACT

A method of forming a structure of 3D NAND memory device, including steps of forming a first stack layer on a substrate, forming a first channel hole extending through the first stack layer, forming a block layer on a surface of the first stack layer and the first channel hole, forming a sacrificial layer in the first channel hole, forming a second stack layer on the first stack layer and the sacrificial layer, performing a first etch process to form a second channel hole extending through the second stack layer and at least partially overlapping the first channel hole and to remove the sacrificial layer in the first channel hole, removing the block layer exposed from the second channel hole, and forming a function layer on a surface of the first channel hole and the second channel hole.

10 Claims, 10 Drawing Sheets

Related U.S. Application Data application No. PCT/CN2018/112177, filed on Oct. 26, 2018.

(51) Int. Cl.
*H01L 21/02* (2006.01)
*H01L 21/311* (2006.01)
*H10B 43/35* (2023.01)

(52) U.S. Cl.
CPC ... *H01L 21/31111* (2013.01); *H01L 21/31144* (2013.01); *H01L 29/40117* (2019.08); *H10B 43/35* (2023.02)

(56) References Cited

U.S. PATENT DOCUMENTS

| | | | |
|---|---|---|---|
| 9,620,512 | B1 | 4/2017 | Nishikawa |
| 9,871,052 | B2 | 1/2018 | Lee |
| 10,475,879 | B1* | 11/2019 | Pachamuthu .......... H10B 43/40 |
| 2014/0264525 | A1 | 9/2014 | Takahashi |
| 2015/0041879 | A1 | 2/2015 | Jayanti |
| 2016/0181259 | A1* | 6/2016 | Van Houdt ............ H10B 51/30 257/295 |
| 2017/0110473 | A1 | 4/2017 | Lee |
| 2017/0117222 | A1* | 4/2017 | Kim .................... H01L 23/5283 |
| 2020/0020713 | A1 | 1/2020 | Choi |

FOREIGN PATENT DOCUMENTS

| | | |
|---|---|---|
| CN | 107507768 A | 12/2017 |
| CN | 108431956 A | 8/2018 |
| CN | 108565266 A | 9/2018 |
| TW | 201039409 A1 | 11/2010 |
| TW | 201519427 A | 5/2015 |
| TW | 201545282 A | 12/2015 |
| TW | 201639150 A | 11/2016 |
| TW | 201810621 A | 3/2018 |
| TW | 201828363 A | 8/2018 |
| TW | 201834215 A | 9/2018 |
| TW | I635573 B | 9/2018 |
| TW | 201836128 A | 10/2018 |

* cited by examiner

STRUCTURE OF 3D NAND MEMORY DEVICE AND METHOD OF FORMING THE SAME

CROSS REFERENCE TO RELATED APPLICATIONS

This application is a divisional of application Ser. No. 16/198,736, filed on Nov. 21, 2018, which is further a continuation of PCT Application No. PCT/CN2018/112177 filed on Oct. 26, 2018, the entire contents of which are incorporated herein by reference.

BACKGROUND OF THE INVENTION

1. Field of the Invention

The present disclosure generally relates to the field of semiconductor technology, and more specifically, to structures of three-dimensional (3D) NAND memory devices and method of forming the same.

2. Description of the Prior Art

The computer environment paradigm has shifted to ubiquitous computing systems that can be used anytime and anywhere. Due to this fact, the use of portable electronic devices such as mobile phones, digital cameras, and notebook computers has rapidly increased. These portable electronic devices generally use a memory system having memory devices, that is, a data storage device. The data storage device is used as a main memory device or an auxiliary memory device in these portable electronic devices. Thus, the reliability and performance of digital data storage, such as a memory system, is critical. These data storage devices using memory devices provide excellent stability, durability, high information access speed, and low power consumption. Examples of data storage devices having such advantages include universal serial bus (USB) memory devices, memory cards having various interfaces, and solid state drives (SSD).

The data storage devices mentioned above may include various flash memory components. The two main types of flash memory components are named after the NAND and NOR logic gates, wherein the NAND-type flash memory may be written and read in blocks (or pages) which are generally much smaller than the entire device, thus it is used in a wide range of applications including mobile phones, digital cameras, and solid-state hard drives. The high storage density of NAND Flash memory, especially when compared to NOR Flash memory, has played a large role in its market penetration.

The NAND string topology has been further developed currently to achieve still greater storage density. Such efforts have led to the development of three-dimensional (3D) NAND Flash memory, in which memory cells are stacked vertically on top of one another in multiple pairs of alternating oxide/metal layers. As 3D NAND memory devices keep scaling more oxide/metal layers in one stack to increase its capacity, it becomes more difficult to use a single etching process to form the channel holes in the 3D memory devices that have a substantial depth. When the aspect ratio of channel hole increases, channel hole etching becomes exponentially slower, and the process capability control of the formed channel holes, including bow-free, straight profile, critical dimension (CD) uniformity, minimal twisting, etc., also tend to be more challenging.

In order to overcome the above-mentioned bottleneck, dual-deck or multi-deck advanced 3D NAND Flash architecture was developed. With two or multiple decks of alternating oxide/metal layers connecting to each other, the number of nodes/pairs may be significantly increased beyond the limitations of process capability.

Nonetheless, there are still many process issues to overcome in the manufacture of multi-deck 3D NAND memory device. For example: (1) the poly-silicon based inter-deck plugs (IDP) formed between the decks may suffer ONO (oxide-nitride-oxide) dielectric residual issue (known as "as L-foot" defect), which may further induce a failure of poly layer inversion. The electrical performances such as data retention and read/erase speed of the cell device are still worse even by using tungsten (W) and poly-silicon to form hybrid IDP layer in order to improve etch gauging control; and (2) single channel formation (SCF) technology may solve the above-described problem by using single channel etch through multiple decks without the intervene of IDP formation. However, this process may involve channel alignments of multiple decks, which may further narrow the process window of deck alignment/overlay. In addition, the layer pairs in the deck may be easily damaged during the process. Improvements are needed to solve these issues in the manufacture of advanced 3D NAND memory devices.

SUMMARY OF THE INVENTION

In accordance with some embodiments of the present disclosure, a structure of three-dimensional (3D) memory devices and method for forming the same are provided.

One aspect of the present disclosure provides a structure of 3D NAND memory device. The 3D NAND memory device includes a substrate, a first stack layer on said substrate, a second stack layer on said first stack layer, a block layer between said first stack layer and said second stack layer; and a channel structure extending through said first stack layer, said block layer and said second stack layer, wherein said channel structure comprises a function layer and a channel layer surrounding by said functional layer.

Another aspect of the present disclosure provides a method of a structure of 3D memory device. The structure of 3D memory device includes forming a first stack layer on a substrate, forming a first channel hole extending through the first stack layer, forming a block layer on a surface of the first stack layer and the first channel hole, forming a sacrificial layer in the first channel hole, forming a second stack layer on the first stack layer and the sacrificial layer, performing a first etch process to form a second channel hole extending through the second stack layer and overlapping the first channel hole and to remove the sacrificial layer in the first channel hole, wherein the first channel hole and the second channel hole are at least partially overlapped, removing the block layer exposed from the second channel hole, and forming a functional layer on a surface of the first channel hole and the second channel hole.

These and other objectives of the present invention will no doubt become obvious to those of ordinary skill in the art after reading the following detailed description of the preferred embodiment that is illustrated in the various figures and drawings.

BRIEF DESCRIPTION OF THE DRAWINGS

Various objectives, features, and advantages of the present disclosure can be more fully appreciated with reference to the detailed description of the present disclosure when considered in contact with the following drawings, in which like reference numerals identify like elements. It is noted that the following drawings are merely examples for illustrative purposes according to various disclosed embodiments and are not intended to limit the scope of the present disclosure.

Embodiments of the present disclosure will be described with reference to the accompanying drawings.

DETAILED DESCRIPTION

Reference will now be made in detail to exemplary embodiments of the invention, which are illustrated in the accompanying drawings in order to understand and implement the present disclosure and to realize the technical effect. It can be understood that the following description has been made only by way of example, but not to limit the present disclosure. Various embodiments of the present disclosure and various features in the embodiments that are not conflicted with each other can be combined and rearranged in various ways. Without departing from the spirit and scope of the present disclosure, modifications, equivalents, or improvements to the present disclosure are understandable to those skilled in the art and are intended to be encompassed within the scope of the present disclosure.

It is noted that references in the specification to "one embodiment," "an embodiment," "an example embodiment," "some embodiments," etc., indicate that the embodiment described may include a particular feature, structure, or characteristic, but every embodiment may not necessarily include the particular feature, structure, or characteristic. Moreover, such phrases do not necessarily refer to the same embodiment.

Further, when a particular feature, structure or characteristic is described in contact with an embodiment, it would be within the knowledge of a person skilled in the pertinent art to affect such feature, structure or characteristic in contact with other embodiments whether or not explicitly described.

In general, terminology may be understood at least in part from usage in context. For example, the term "one or more" as used herein, depending at least in part upon context, may be used to describe any feature, structure, or characteristic in a singular sense or may be used to describe combinations of features, structures or characteristics in a plural sense. Similarly, terms, such as "a," "an," or "the," again, may be understood to convey a singular usage or to convey a plural usage, depending at least in part upon context.

It should be readily understood that the meaning of "on," "above," and "over" in the present disclosure should be interpreted in the broadest manner such that "on" not only means "directly on" something but also includes the meaning of "on" something with an intermediate feature or a layer therebetween, and that "above" or "over" not only means the meaning of "above" or "over" something but can also include the meaning it is "above" or "over" something with no intermediate feature or layer therebetween (i.e., directly on something).

Further, spatially relative terms, such as "beneath," "below," "lower," "above," "upper," and the like, may be used herein for ease of description to describe one element or feature relationship to another element (s) or feature (s) as illustrated in the figures.

The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

As used herein, the term "substrate" refers to a material onto which subsequent material layers are added. The substrate itself can be patterned. Materials added on top of the substrate can be patterned or can remain non-patterned. Furthermore, the substrate can include a wide array of semiconductor materials, such as silicon, germanium, gallium arsenide, indium phosphide, etc. Alternatively, the substrate can be made from an electrically non-conductive material, such as a glass, a plastic, or a sapphire wafer.

As used herein, the term "layer" refers to a material portion including a region with a thickness. A layer can extend over the entirety of an underlying or overlying structure, or may have an extent less than the extent of an underlying or overlying structure. Further, a layer can be a region of a homogeneous or inhomogeneous continuous structure that has a thickness less than the thickness of the continuous structure. For example, a layer can be located between any pair of horizontal planes between, or at, a top surface and a bottom surface of the continuous structure. A layer can extend horizontally, vertically, and/or along a tapered surface. A substrate can be a layer, can include one or more layers therein, and/or can have one or more layer thereupon, thereabove, and/or therebelow. A layer can include multiple layers. For example, an interconnect layer can include one or more conductor and contact layers (in which contacts, interconnect lines, and/or through holes are formed) and one or more dielectric layers.

As used herein, the term "nominal/nominally" refers to a desired, or target, value of a characteristic or parameter for a component or a process operation, set during the design phase of a product or a process, together with a range of values above and/or below the desired value. The range of values can be due to slight variations in manufacturing processes or tolerances. As used herein, the term "about" indicates the value of a given quantity that can vary based on a particular technology node associated with the subject semiconductor device. Based on the particular technology node, the term "about" can indicate a value of a given quantity that varies within, for example, 10-30% of the value (e.g., ±10%, ±20%, or ±30% of the value).

In accordance with some embodiments of the present disclosure, joint opening structures of three-dimensional (3D) memory devices and method for forming the same are provided to reduce the process difficulty and cost of the channel hole structures in 3D memory devices.

As used herein, the term "3D memory device" refers to a semiconductor device with vertically oriented strings of memory cell transistors (referred to herein as "memory strings," such as NAND strings) on a laterally-oriented substrate so that the memory strings extend in the vertical direction with respect to the substrate. As used herein, the term "vertical/vertically" means nominally perpendicular to the lateral surface of a substrate, while the term "horizontal/horizontally" means nominally parallel to the lateral surface of a substrate.

Figure 12:
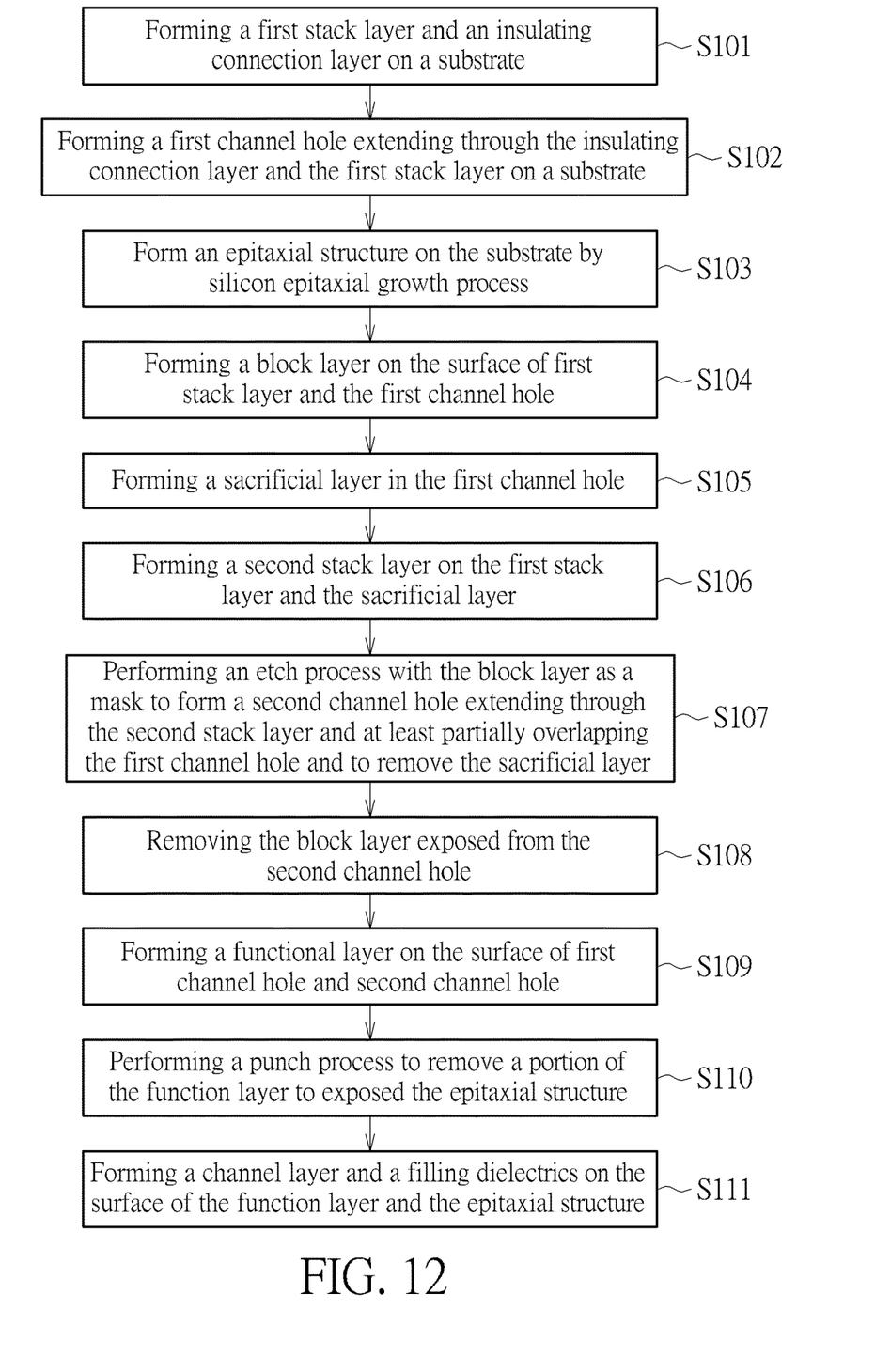
FIG. 12 illustrates schematic flow diagrams of an exemplary fabricating process for forming a structure of 3D memory device are illustrated in accordance with some embodiments of the present disclosure.

Referring to FIG. 12, schematic flow diagrams of an exemplary manufacturing process for forming a structure of 3D memory device are illustrated in accordance with some embodiments of the present disclosure. FIGS. 1-10 illustrate schematic structural cross-sectional diagrams of an exemplary joint opening structure of 3D memory device at certain stages of the manufacturing process shown in FIG. 10.

As shown in FIG. 12, at S101, a first stack layer 2 and an insulating connection layer 3 can be sequentially formed on the surface of a substrate 1.

Figure 1:
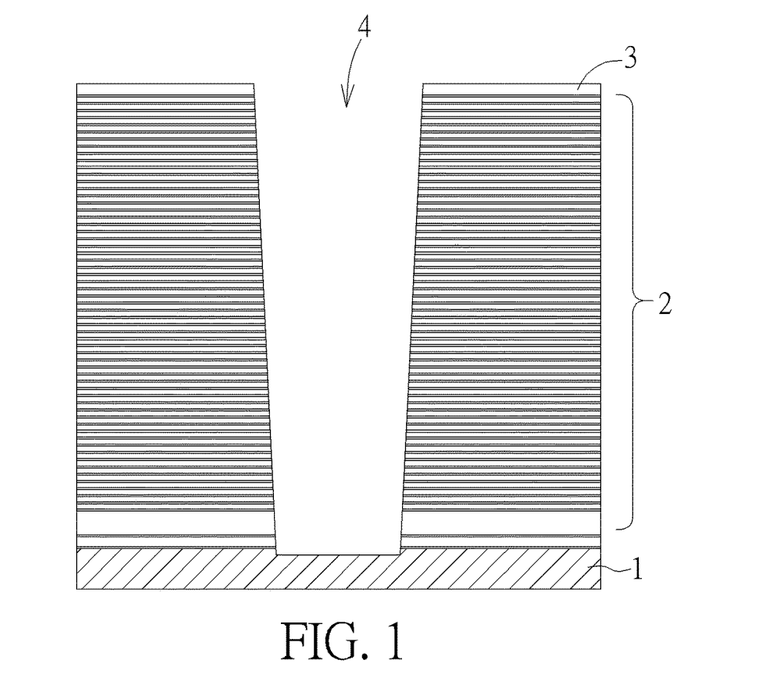
FIGS. 1-10 illustrates schematic structural cross-sectional diagrams of an exemplary structure of 3D memory device at certain stages of a fabricating process in accordance with some embodiments of the present disclosure.

As shown in FIG. 1, the first stack layer 2 can be formed on the substrate 1. The first stack layer 2 can include multiple dielectrics/gate-line sacrificial layer pairs, e.g. silicon oxide/nitride (ON) layer pairs. The oxide/nitride layer pair is also referred to herein as an "alternating oxide/nitride stack." That is, in the first stack layer 2, multiple oxide layers and multiple nitride layers alternate in a vertical direction. In other words, except a top and a bottom layer of a given stack, each of the other oxide layers can be sandwiched by two adjacent nitride layers, and each nitride layer can be sandwiched by two adjacent oxide layers.

The oxide layers of oxide/nitride stack can each have the same thickness or have different thicknesses. For example, a thickness of each oxide layer can be in a range from 1~100 nm, preferably about 25 nm. Similarly, nitride layer of oxide/nitride stack can each have the same thickness or have different thicknesses. For example, a thickness of each nitride layer can be in a range from 1~100 nm, preferably about 35 nm.

It is noted that, in the present disclosure, the oxide layers and/or nitride layers of oxide/nitride stack can include any suitable oxide materials and/or nitride materials. For example, the element of the oxide materials and/or nitride materials can include, but not limited to, W, Co, Cu, Al, doped silicon, silicides, or any combination thereof. In some embodiments, the oxide layers can be silicon oxide layers, and the nitride layers can be silicon nitride layer.

The first stack layer 2 can include any suitable number of layers of the oxide layers and the nitride layers. In some embodiments, a total number of layers of the oxide layers and the nitride layers in the first stack layer 2 is equal to or larger than 64. In some embodiments, alternating stack of dielectric/gate-line sacrificial layer pairs stack includes more oxide layers or more nitride layers with different materials and/or thicknesses than the oxide/nitride layer pair.

As shown in FIG. 1, the insulating connection layer 3 can be formed on the first stack layer 2 to connect with second stack layer to be formed in later process. In some embodiments, the insulating connection layer 3 can be made by any suitable insulating material and/or dielectric material, such as silicon oxide. It is noted that, the material of the insulating connection layer 3 can be different from the material of the nitride layer in the first stack layer 2.

In the embodiment, the substrate 1 may be provided with well regions that are formed in advance by implantation process, such as high-voltage P-well (HVPW), high-voltage N-well (HVNW), and deep N-well (DNW), etc, and there may be other additional layers between the substrate 1 and the first stack layer 2. For the simplicity of drawing and not to obscure the essential features of present disclosure, the above-mentioned well regions and additional layers will not be shown in figure.

Referring to FIG. 12, at S102, after the first stack layer 2 and the insulating connection layer 3 are formed, a first channel hole 4 can be formed. As shown in FIG. 1, the first channel hole 4 can completely penetrate through the insulating connection layer 3 and the first stack layer 2, and can extend into the surface of the substrate 1, ex. about 50-100 nm. The first channel hole 4 may be formed by performing a photolithographic process including forming pattern masks (not shown) on the insulating connection layer 3.

The pattern masks used in the photolithographic process may include dielectric anti-reflection coating (DARC), carbon hard mask, bottom anti-reflection coating (BARC) and photoresist (PR). The pattern of first channel hole 4 is defined by the photoresist and may then be transferred to the carbon hard mask and the first stack layer 2 below by an etching process to form the first channel hole 4. It is noted that, the term "etching process" used in the present disclosure can be referred to any suitable etching process including, but not limit to, a wet etching, a dry etching, or a combination thereof, with optional asking and cleaning processes to remove the remaining mask layers. For the simplicity of drawing and not to obscure the essential features of present disclosure, the above-mentioned pattern masks will not be shown in figure.

The first stack layer 2, the insulating connection layer 3, and/or the above-mentioned mask layers can be formed by using one or more deposition processes. It is noted that, the term "deposition process" used in the present disclosure can be referred to any suitable deposition process including, but not limited to, a chemical vapor deposition (CVD) process, a physical vapor deposition (PVD) process, an atomic layer deposition (ALD) process, and/or any suitable combination thereof.

Figure 2:
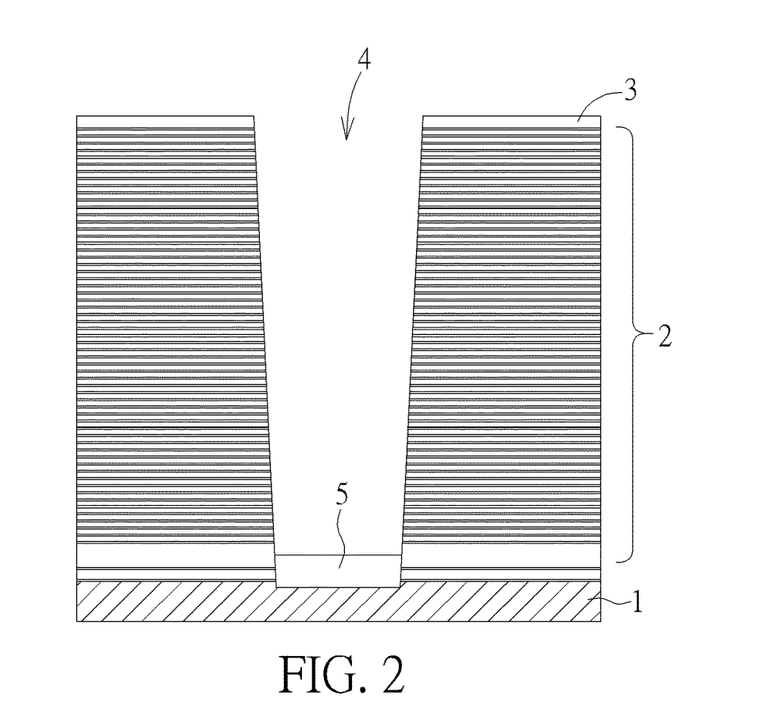

Referring to FIG. 12, at S103, after the first channel hole 4 is formed, a channel structure 5 can be formed on the surface of the substrate 1 that is exposed by the first channel hole 4, as shown in FIG. 2. In some embodiments, the channel structure 5 can be a polycrystalline silicon (polysilicon) layer or a single crystalline silicon layer formed by using a selective epitaxial process, such as a silicon epitaxial growth (SEG) process. This process may be modulated to control the threshold voltage of bottom select gate. In some embodiments, the channel structure 5 may not be directly formed on the surface of the substrate 1. One or more layers can be formed between the channel structure 5 and the substrate 1. That is, the channel structure 5 is overlayed on the substrate 1. In addition, a pre-clean process and implantation process may be performed respectively before and after the formation of the epitaxial channel structure 5 to improve the electrical property of the Si-based channel structure 5.

Figure 3:
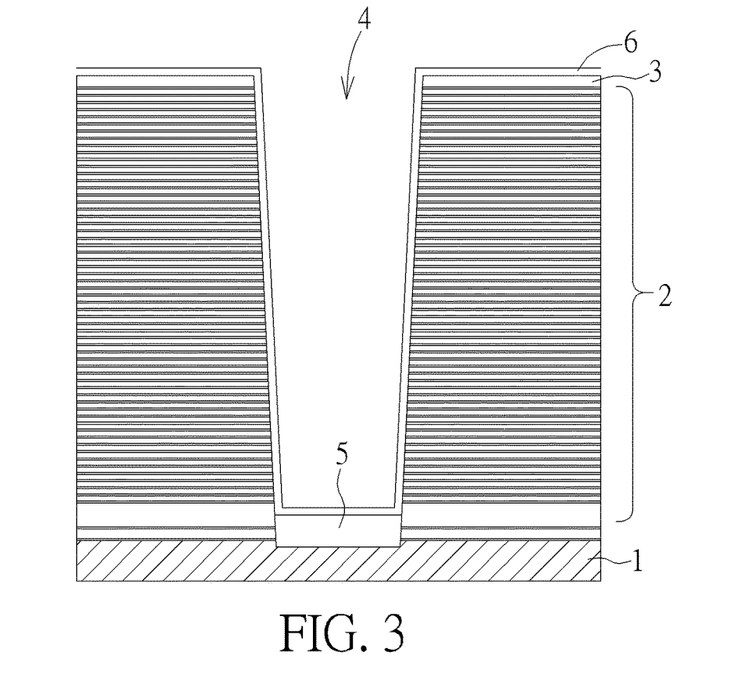

At S104, after the channel structure 5 is formed, a block layer 6 can be formed on the top surface of insulating connection layer 3 and the sidewall of first channel hole 4, as shown in FIG. 3. In the embodiment, the material of block layer 6 may be titanium nitride (TiN) or tungsten (W), but not limited thereto. The block layer 6 will act as a self-alignment layer in later process, and the block layer 6 would also cover the exposed surface and sidewall of channel structure 5 to provide protection in later process.

Figure 4:
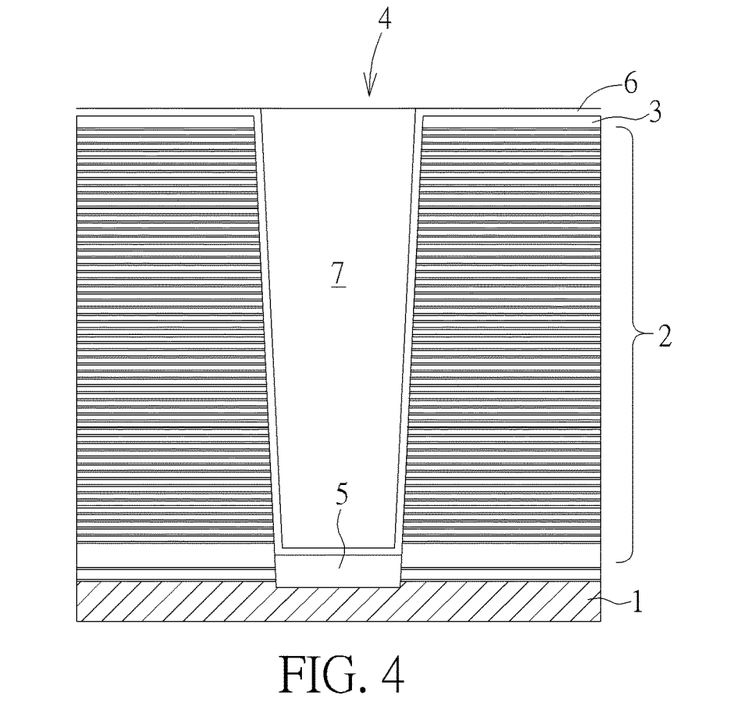

Referring to FIG. 12, at S105, after the block layer 6 is formed, a sacrificial layer 7 can be formed to cover the block layer 6 and fill the first channel hole 4, as shown in FIG. 4. In some embodiments, the material of sacrificial layer 7 may be any material with high deposition rate for quick filling and sealing the first channel hole 4 and with high dry etch selectivity to metal (i.e. to the block layer 6 below), such as silicon, silicon oxide, silicon nitride, silicon oxynitride. In some embodiments, the sacrificial layer 7 may have one or more air gaps.

As shown in FIG. 4, a portion of the sacrificial layer 7 above the top surface of block layer 6 may be removed, so that the top surface of the sacrificial layer 7 can be flat with the top surface of block layer 6. In some embodiments, the portion of sacrificial layer 7 above the block layer 6 may be removed by using an etching process or a chemical mechanical process (CMP) that stops on the block layer 6.

Figure 5:
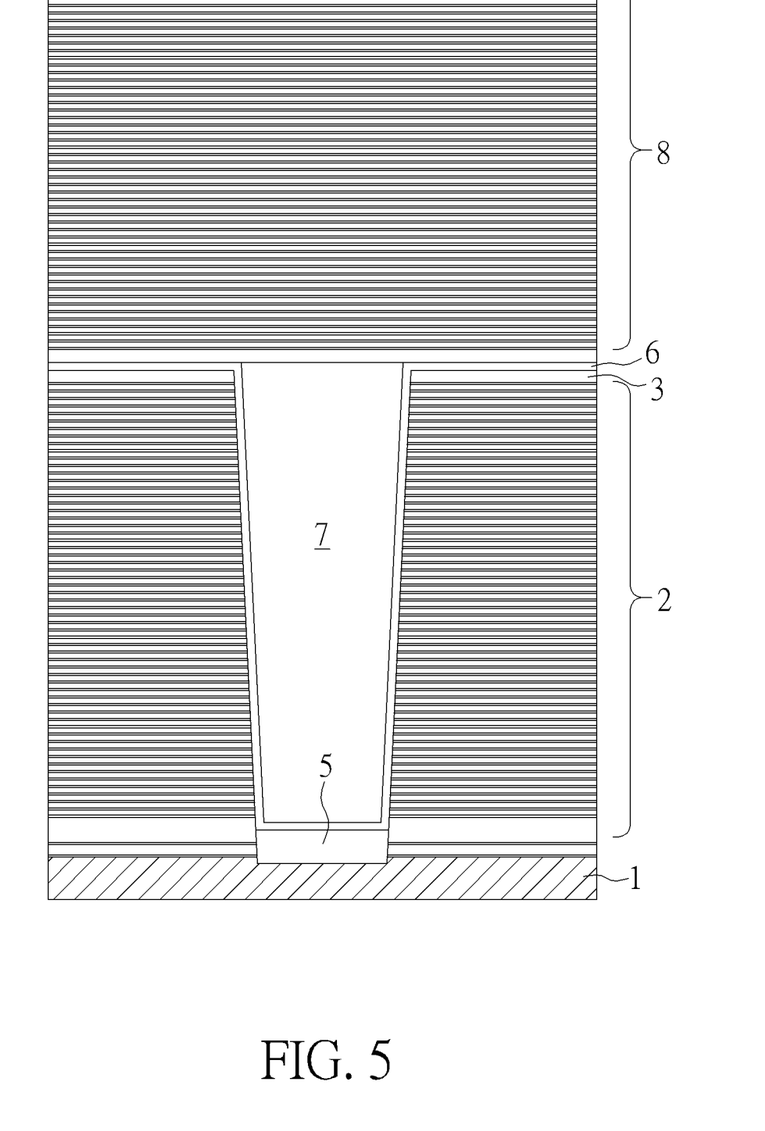

Referring to FIG. 12, at S106, after the sacrificial layer 7 is formed, a second stack layer 8 can be formed on the flushed first stack layer 2 and the sacrificial layer 7. Similarly, as shown in FIG. 5, the second stack layer can include multiple oxide/nitride (ON) layer pairs with alternating oxide/nitride stack. The oxide layers and the nitride layers of oxide/nitride stack can each have the same thickness or have different thicknesses. It is noted that, in the present disclosure, the oxide layers and/or nitride layers of oxide/nitride stack can include any suitable oxide materials and/or nitride materials. For example, the element of oxide materials and/or nitride materials can include, but not limited to, W, Co, Cu, Al, doped silicon, silicides, or any combination thereof. In some embodiments, the oxide layers can be silicon oxide layers, and the nitride layers can be silicon nitride layer.

Similarly, the second stack layer 8 can include any suitable number of layers of the oxide layers and the nitride layers. In some embodiments, a total number of layers of the oxide layers and the nitride layers in the second stack layer 2 is equal to, smaller, or larger than 64. In some embodiments, alternating conductor/dielectric stack includes more oxide layers or more nitride layers with different materials and/or thicknesses than the oxide/nitride layer pair.

Figure 6:
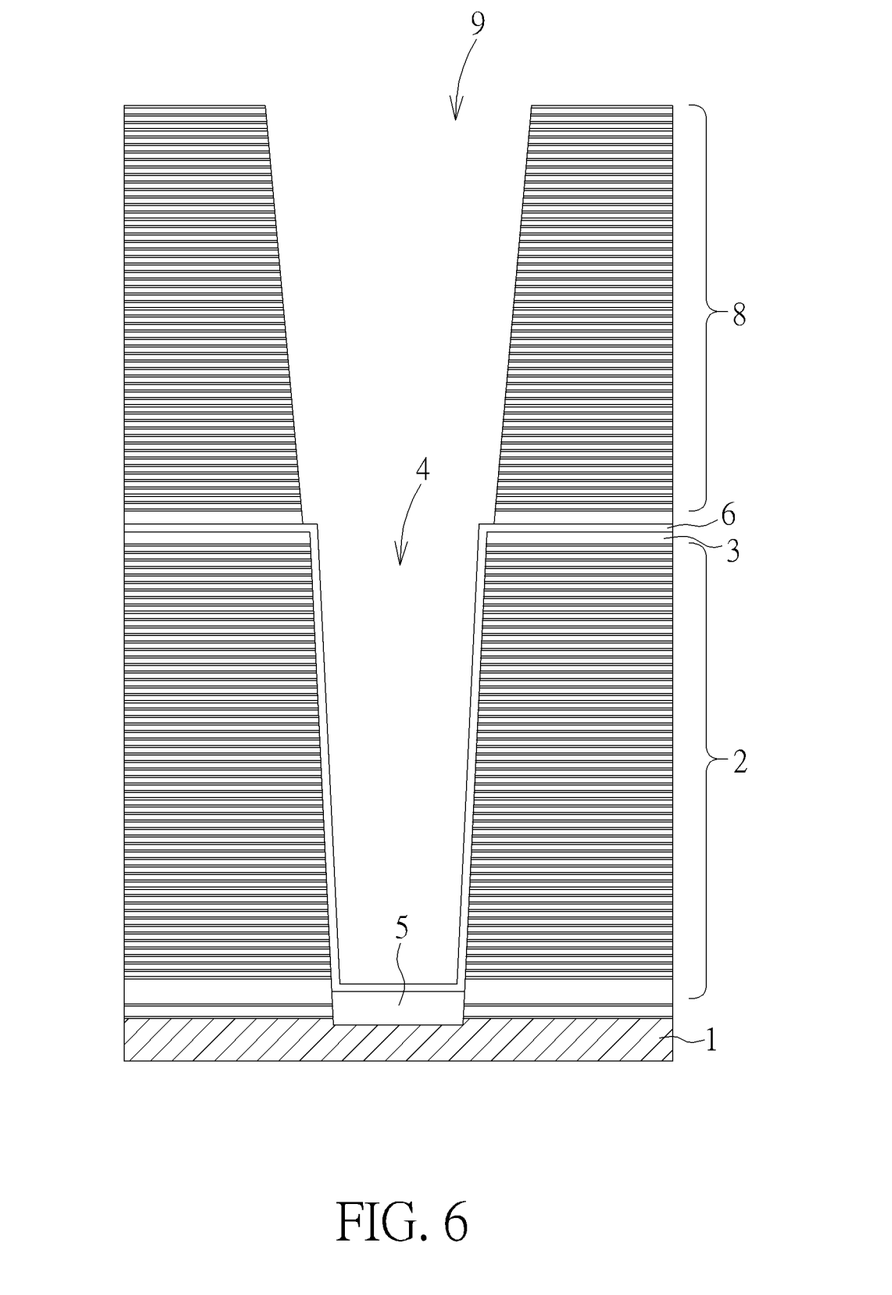

Referring to FIG. 12, at S107, after the second stack layer 8 are formed, a second channel hole can be formed. As shown in FIG. 6, the second channel hole 9 can completely penetrate through the second stack layer 8 and connect with the first channel hole 4 thereunder. Similarly, the second channel hole 9 may be formed by performing a photolithographic process including forming pattern masks, ex. DARC, carbon hard mask, BARC and PR (not shown), on the second stack layer 8. The pattern of second channel hole is defined by the photoresist and may then be transferred to the carbon hard mask and the first stack layer 2 below by an etching process to form the first channel hole 4. In order to connect with the first channel hole 4, the defined pattern of second channel hold 9 should be completely, or at least partially, overlap the first channel hole 4.

It is noted that, the etch process performed to form the second channel hole 9 would also remove the sacrificial layer 7 thereunder on the block layer 6. The block layer 6 would act as a self-alignment layer and etch stop layer in this process since the sacrificial layer 7 is made with high dry etch selectivity (>50:1) to the block layer 6. In this way, the oxide/nitride stack of first stack layer 2 covered by the block layer 6 would not be damaged in the etch process. The oxide/nitride stack damage issue in prior art is, therefore, solved.

In addition, in the embodiment, the use of metal material as a protection or etch stop layer is much better than the silicon oxide formed either by in-situ steam generation (ISSG) or atomic layer deposition (ALD) or thermal oxidation that has been described in prior art, since it may provide better protection to the surface and sidewall of channel structure 5 thereunder from the plasma damage during the etch process of forming the second channel hole 9.

Furthermore, since the etch process performed to form the second channel hole 9 is self-aligned by the block layer 6, the alignment/overlay process window of second channel hole 9 to the first channel hole 4 may double or even triple in comparison to prior art that no metal-based liner is formed between the first stack layer 2 and the second stack layer 8.

The significant increase in overlay window between the two involved stacks may also allow the diameter of upper second channel hole 9 to be larger than the diameter of lower first channel hole 4 as shown in FIG. 6. This may further provide more process window (double or triple to prior art) for later channel punch process, which the detail will be described in following embodiment.

Figure 7:
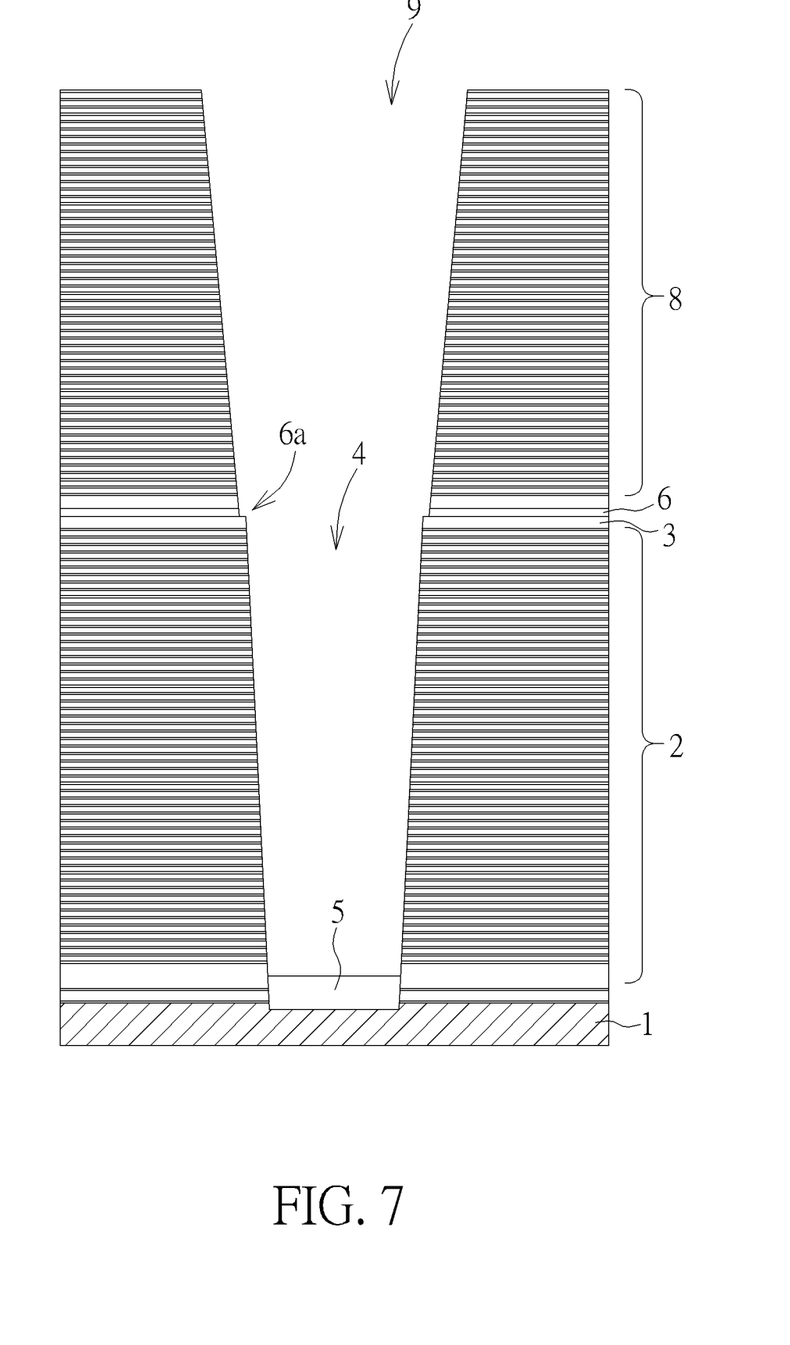

Referring to FIG. 12, at S108, after the second channel hole 9 is formed, the exposed block layer 6 can be formed. As shown in FIG. 7, the block layer 6 on the sidewall of first channel hole 4 and second channel hole 9 can be completely removed. In some embodiment, the remaining sacrificial layer 7 on the block layer 6 may be first removed by a wet cleaning process. A plasma dry etch process or a wet etch process with chemicals like diluted $H_2O_2$ or SC1 ($H_2O_2$+ammonia+$H_2O$) may then be performed to easily remove the exposed block layer 6 without damaging the oxide/nitride stack of first and second stack layer 2 and 8 once covered by the block layer 6. In the embodiment, the block layer 6 between the first stack layer 2 and the second stack layer 8 will not be removed.

Figure 8:
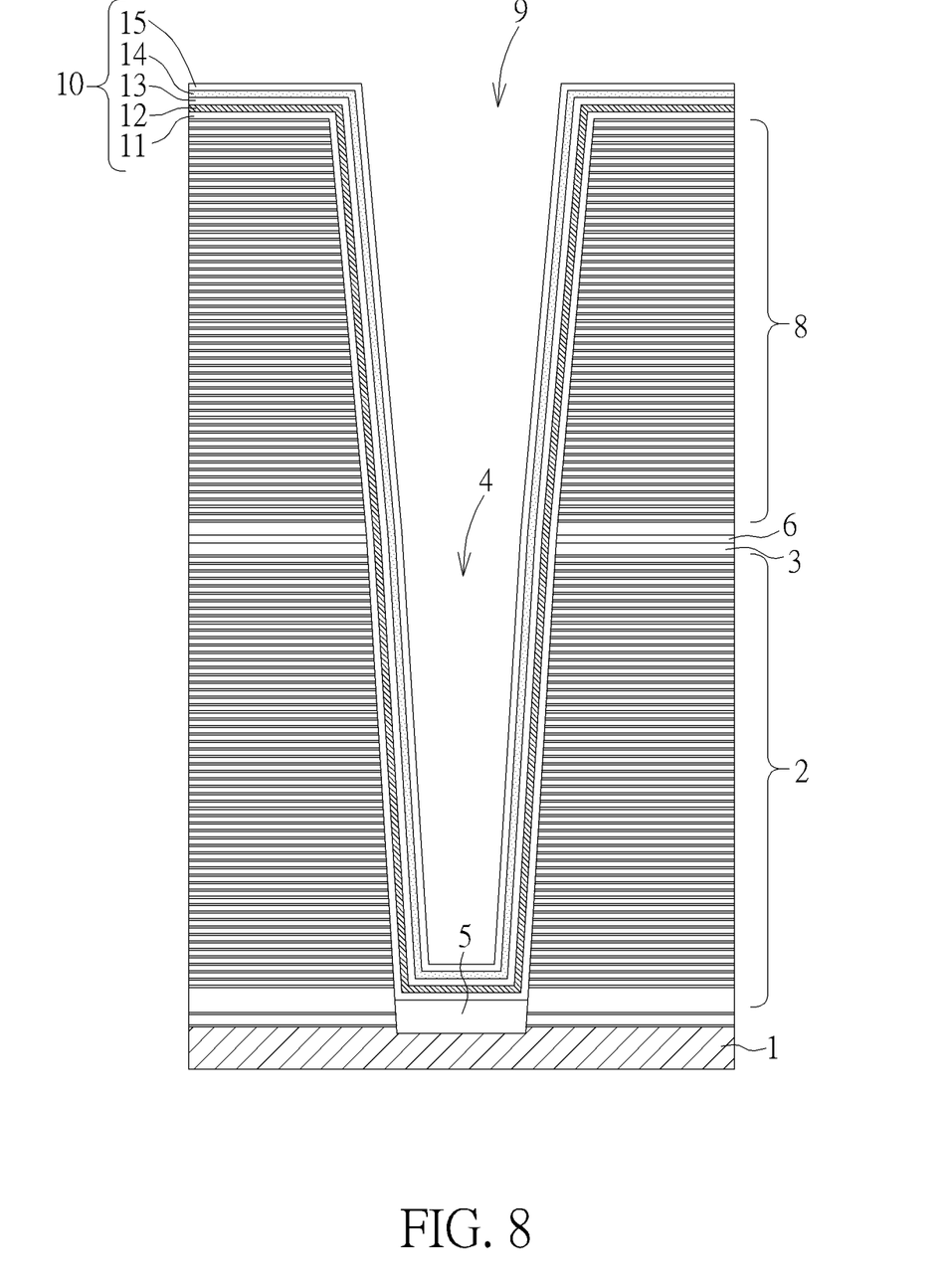

Referring to FIG. 12, at S109, after the block layer 6 is removed, a functional layer 10 can be formed on the sidewall of first channel hole 4 and second channel hole 9. In the embodiment, the functional layer 10 provides several layer structures to achieve respective functions, which include a barrier layer 11, a charge trapping layer 12, a tunneling layer 13, a charge transport layer 14, and a capping layer 15. As shown in FIG. 8, the barrier layer 11 can be formed on the surface of first stack layer 2 and second stack layer 8, including the first channel hole 4 and second channel hole 9. The barrier layer 11 can be used for blocking the outflow of electronic charges stored in a charge trapping layer and provide electrically insulation between the charge trapping layer and adjacent layer, such as first and second stack layers 2, 8 and block layer 6. In some embodiments, the barrier layer 11 can be a silicon oxide layer. In some embodiments, the barrier layer 13 may include high dielectric constant (high-k) dielectrics (e.g., aluminum oxide). In one example, the barrier layer 13 is a single or multiple-layer oxide formed by using a deposition process or by using a nitride layer treated with in-situ steam generation (ISSG) process.

The charge trapping layer 12 can be formed on the surface of barrier layer 11. The charge trapping layer 12 can be used for storing electronic charges. The storage or removal of charge in the charge trapping layer 12 can impact the on/off state and/or a conductance of the semiconductor channel. In some embodiments, the charge trapping layer 12 can be a nitride layer formed by using a deposition process. In some other embodiments, the charge trapping layer 12 could be also a multi-layer structure of SiN/SiON/SiN or even more layers.

The tunneling layer 13 can be formed on the charge trapping layer 12. The tunneling layer 13 can be used for data retention by inhibition of trapping and/or detrapping electronic charges (electrons or holes). In some embodiments, the tunneling layer 11 can be an oxide layer formed by using a deposition process. In some other embodiments, the charge trapping layer 12 could be also a multi-layer structure of $SiO_2$/SiON/$SiO_2$ or even more layers.

The charge transport layer 14 can be formed on the surface of tunneling layer 13. The charge transport layer 14 can be used for transporting required electronic charges (electrons or holes), especially it may merge with channel layer to be formed in later process. The charge transport layer 14 may also function as a sacrificial layer with or without the capping layer in later punch process. In some embodiments, the charge transport layer 14 can be a poly-silicon layer formed by using a deposition process.

The capping layer 15 can be formed on the surface of the charge transport layer 14. The capping layer 15 can be used as a sacrificial layer with the charge transport layer 14 to protect the barrier layer 11, the charge trapping layer 12 and the tunneling layer 13 from being damaged in a subsequent punch process. In some embodiments, the capping layer 15 can be an oxide layer formed by using a deposition process.

Figure 9:
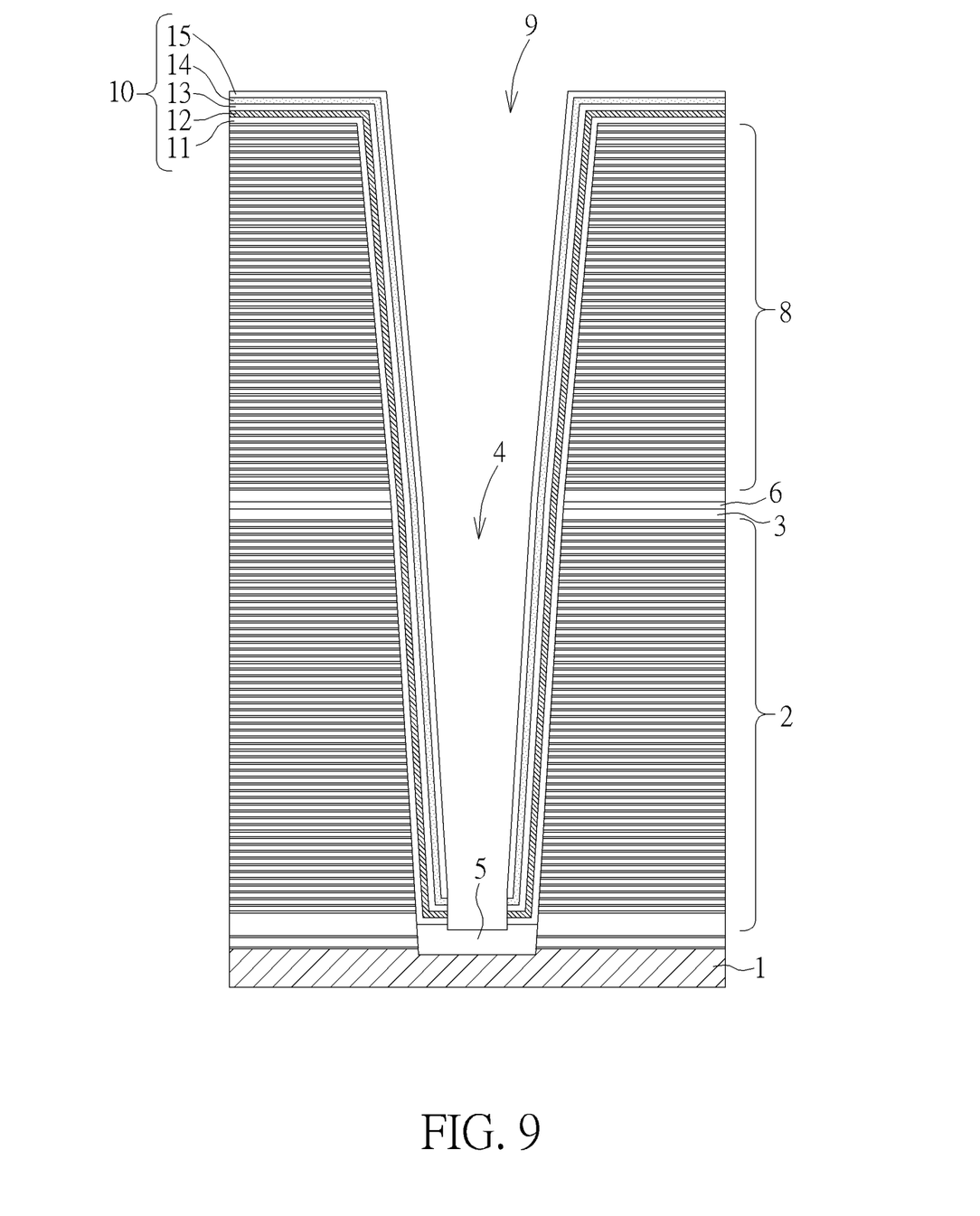

Referring to FIG. 12, at S110, after the functional layer 10 is formed, a portion of the functional layer 10 located on the top surface of the channel structure 5 on the bottom of the first channel hole 4 can be removed, as shown in FIG. 9. This process is referred as a punch process. In the embodiments, the punch process uses the capping layer 15 and a portion of the charge transport layer 14 as a sacrificial layer to perform an etching process with large bias voltage to provide anisotropic etching force to the substrate plane and punch through the entire functional layer 10 at the bottom of first channel hole. As such, the channel structure 5 may be exposed from the function layer 10 to connect with the channel layer to be formed in later process. In some other embodiments, only poly-Si has been used as sacrificial layer for protection of barrier layer 11/charge trapping layer 12/tunneling layer 13 during etch processes.

Figure 10:
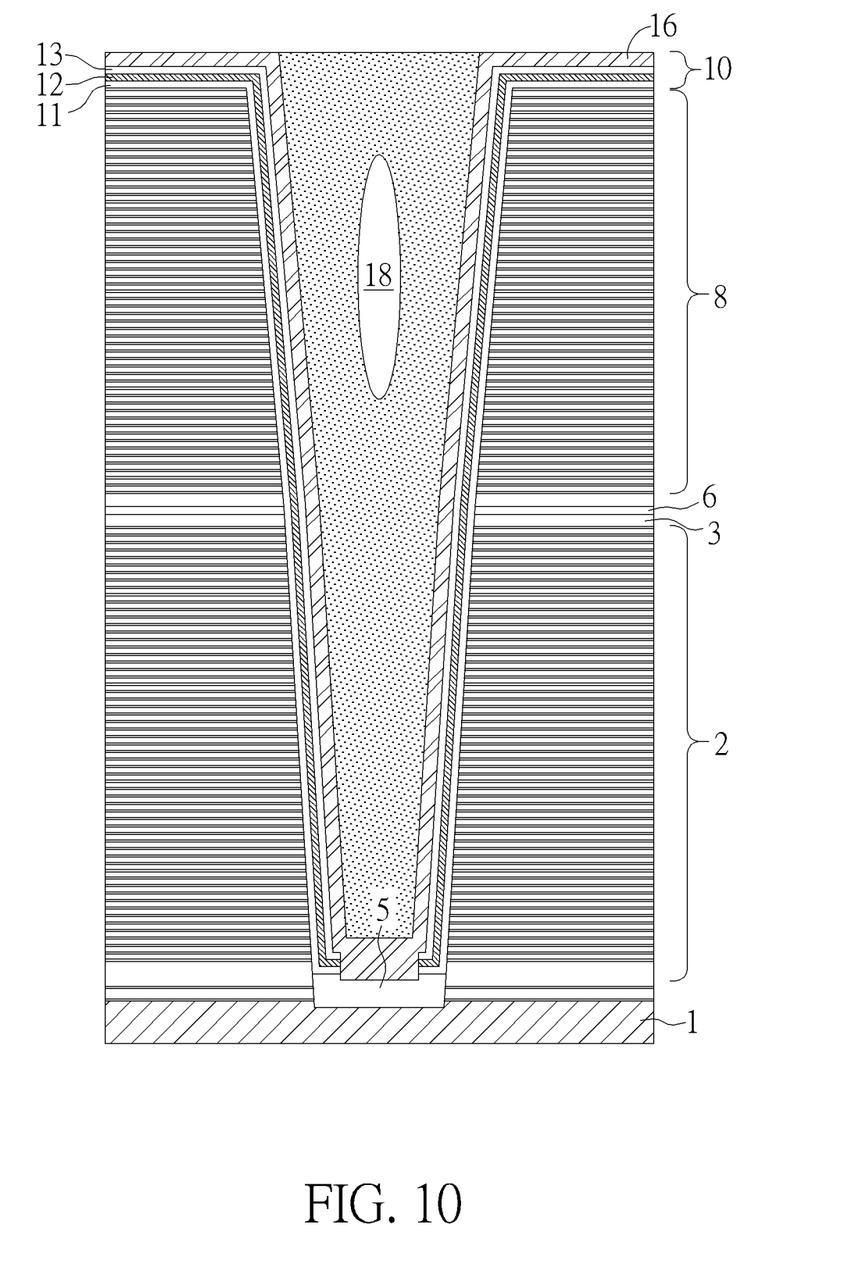

Referring to FIG. 12, at S111, after the punch process, a second poly-Si channel layer 16 can be sequentially formed on the sidewall of functional layer 10 and filling up the opening that exposes the channel structure 5. As shown in FIG. 10, the channel layer 16 can be formed conformally to cover the sidewall of the functional layer 10 and connect with the channel structure 5 at the bottom of the first stack layer 2. The channel layer 16 can also cover the top surface of the function layer 10 and merge with the charge transport layer 14 remaining from the punch process. In some embodiments, the channel layer 11 can be a thick poly-silicon layer formed by using a deposition process. In some other embodiments, the first poly-Si channel layer 11 is thoroughly removed after playing its role of sacrificial layer for protection of barrier layer 11/charge trapping layer 12/tunneling layer 13 during etch processes, then the second poly-Si channel layer 16 has been grown upon the tunneling layer.

As shown in FIG. 10, a filling dielectrics 17 can be formed to cover the channel layer 16 and fill up the first channel hole and second channel hole. In some embodiments, the filling dielectric 17 can be an oxide layer formed by using a deposition and/or spin-on coating process and following up with a CMP process. In some embodiments, the filling dielectric 17 can include one or more air gaps 18. Preferably, the air gap 18 may be formed in the second channel hole 9 that has larger diameter.

Please note that, in later process, the gate-line sacrificial layers (nitride) in the alternating oxide/nitride (ON) stack 2 and 8 would be removed and be replaced with metal layers to form gate lines. The embodiment and process flow disclosed in this disclosure show only the ON stack before the metal replacement. The final product of the 3D NAND memory device should be provided with stack layers with alternating oxide/metal layer pairs.

Figure 11:
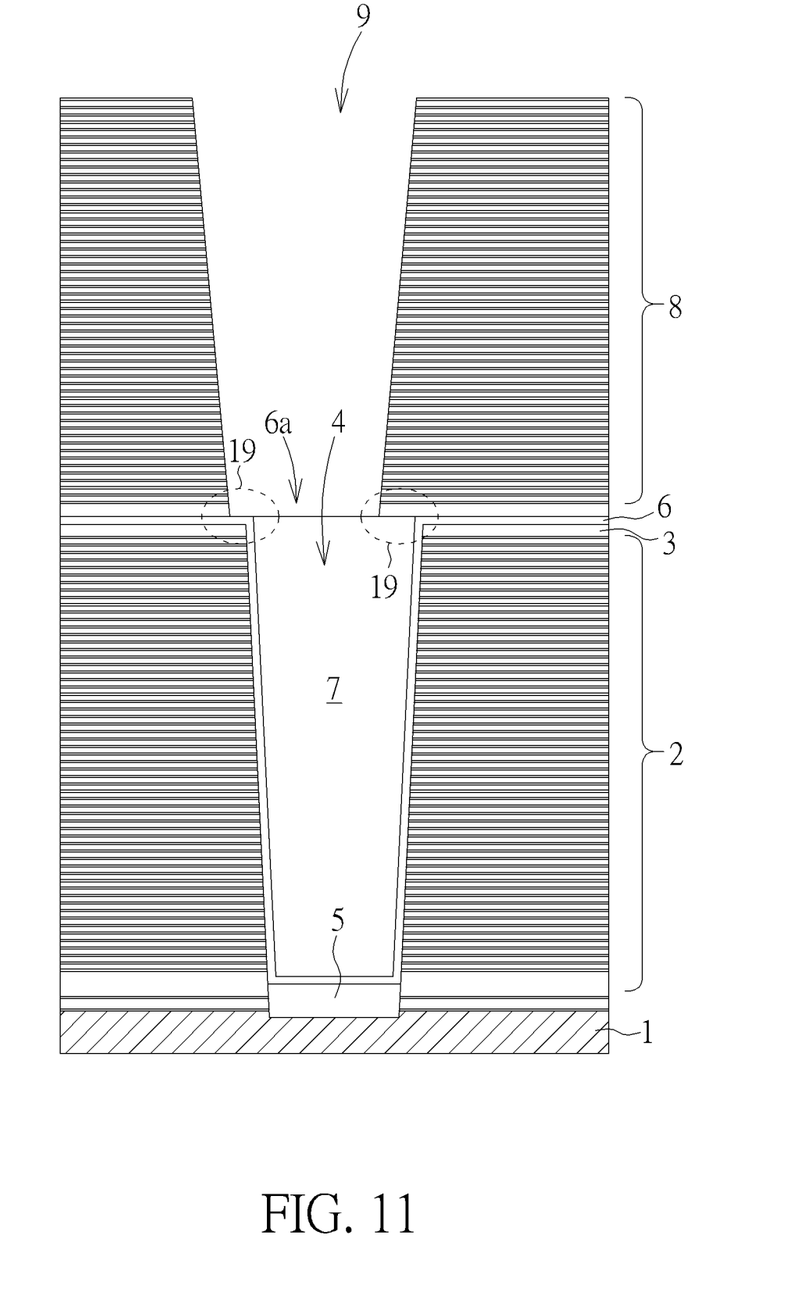
FIG. 11 illustrates schematic structural cross-sectional diagrams of an exemplary structure of 3D memory device at certain stages of a fabricating process in accordance with some other embodiments of the present disclosure.

In addition, the embodiment shown in FIG. 7 discloses the condition that the first channel hole 4 and the second channel hole 9 are completely overlapped. The entire sidewall of an opening 6a through the block layer 6 would aligned with the sidewall of second channel hole 9. However, in other embodiment such as the one shown in FIG. 11, the first channel hole 4 and the second channel hole 9 are only partially overlapped, and only a portion of the sidewall of opening 6a would be aligned with the sidewall of lower first channel hole 4, so as to form zigzag portions 19 at sidewalls between the first channel hole 4 and the second channel hole 9. The block layer 6 and the insulating connection layer 3 are included in the zigzag portions 19.

The provision of the examples described herein (as well as clauses phrased as "such as," "e.g.," "including," and the like) should not be interpreted as limiting the claimed subject matter to the specific examples; rather, the examples are intended to illustrate only some of many possible aspects.

Further, the words "first", "second" and the like used in this disclosure do not denote any order, quantity or importance, but are merely intended to distinguish between different constituents. The words "comprise" or "include" and the like mean that the elements or objects preceding the word can cover the elements or objects listed after the word and their equivalents, without excluding other elements or objects. The words "connect" or "link" and the like are not limited to physical or mechanical connections, but can include electrical connections, either directly or indirectly.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. A method of forming a structure of 3D NAND memory device, comprising:
   forming a first stack layer on a substrate;
   forming a first channel hole extending through said first stack layer;
   forming a block layer on a surface of said first stack layer and on a sidewall of said first channel hole;
   forming a sacrificial layer in said first channel hole;
   forming a second stack layer on said first stack layer and said sacrificial layer;
   performing a first etch process to form a second channel hole extending through said second stack layer and completely overlapping said first channel hole and to remove said sacrificial layer in said first channel hole, wherein a minimum diameter of said second channel hole is larger than a maximum diameter of said first channel hole;
   removing said block layer exposed from said second channel hole; and
   forming a function layer on a surface of said first channel hole and said second channel hole.

2. The method of forming a structure of 3D NAND memory device of claim 1, further comprising performing a silicon epitaxial growth process to form an epitaxial structure on said substrate exposed from said first channel hole before forming said block layer.

3. The method of forming a structure of 3D NAND memory device of claim 2, further comprising performing a second etch process to remove a portion of said functional layer and expose said epitaxial structure.

4. The method of forming a structure of 3D NAND memory device of claim 3, further comprising forming a channel layer on a surface of said functional layer and said epitaxial structure after said second etch process.

5. The method of forming a structure of 3D NAND memory device of claim 4, further comprising forming a filling dielectrics on said channel layer and filling up said first channel hole and said second channel hole.

6. The method of forming a structure of 3D NAND memory device of claim 5, wherein said filling dielectrics comprises one or more air gap.

7. The method of forming a structure of 3D NAND memory device of claim 1, wherein said first stack layer and said second stack layer comprises dielectric/nitride layer pairs.

8. The method of forming a structure of 3D NAND memory device of claim 1, wherein said functional layer comprises a barrier layer, a charge trapping layer and a tunneling layer.

9. The method of forming a structure of 3D NAND memory device of claim 1, wherein a material of said block layer comprises titanium nitride (TiN) or tungsten (W).

10. The method of forming a structure of 3D NAND memory device of claim 1, wherein said block layer acts as a self-alignment layer and etch stop layer in said first etch process so that said first etch process only removes said second stack layer and said sacrificial layer in said first channel hole, and said block layer is not damaged in said first etch process.

\* \* \* \* \*